(12) United States Patent
Li

(10) Patent No.: US 11,502,814 B2
(45) Date of Patent: Nov. 15, 2022

(54) DEVICE AND METHOD FOR REALIZING DATA SYNCHRONIZATION

(71) Applicant: ZTE Corporation, Shenzhen (CN)

(72) Inventor: Peng Li, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 17/416,260

(22) PCT Filed: Oct. 22, 2019

(86) PCT No.: PCT/CN2019/112558
§ 371 (c)(1),
(2) Date: Jun. 18, 2021

(87) PCT Pub. No.: WO2020/125189
PCT Pub. Date: Jun. 25, 2020

(65) Prior Publication Data
US 2022/0078004 A1 Mar. 10, 2022

(30) Foreign Application Priority Data

Dec. 20, 2018 (CN) .......................... 201811564486.6

(51) Int. Cl.
*H04L 7/00* (2006.01)
*G06F 1/06* (2006.01)
(Continued)

(52) U.S. Cl.
CPC .............. *H04L 7/0037* (2013.01); *G06F 1/06* (2013.01); *G06F 12/0238* (2013.01); *H03L 7/08* (2013.01);
(Continued)

(58) Field of Classification Search
CPC ....... H04L 7/0037; H04L 7/0331; G06F 1/06; G06F 12/0238; G06F 2212/202; H03L 7/08; H03L 7/0814
(Continued)

(56) References Cited

U.S. PATENT DOCUMENTS 9,564,913 B1 2/2017 Courey
2002/0196883 A1* 12/2002 Best ...................... H03L 7/0814
375/355
(Continued)

FOREIGN PATENT DOCUMENTS

CN 101237318 A 8/2008
CN 101662301 A 3/2010
(Continued)

OTHER PUBLICATIONS

Song, Jingliang. Research on MIMO System Platform and Its Synchronization Technology Based on AD936, Electronics Quality, Aug. 20, 2018 (Aug. 20, 2018), ISSN: 1003-0107, Southwest China Institute of Electronic Technology, Sichuan Chengdu, China.
(Continued)

*Primary Examiner* — Phuong Phu
(74) *Attorney, Agent, or Firm* — Vivacqua Crane, PLLC

(57) ABSTRACT

Disclosed are a device and method for realizing data synchronization. The device may include a synchronization circuit for a plurality of radio frequency (RF) chips, configured to realize work clock synchronization among the plurality of RF chips; and/or, a synchronization circuit for a plurality of channels in a single chip, configured to realize data synchronization among the plurality of channels in the single chip.

16 Claims, 5 Drawing Sheets

(51) Int. Cl.
*G06F 12/02* (2006.01)
*H03L 7/08* (2006.01)
*H04L 7/033* (2006.01)

(52) U.S. Cl.
CPC ...... *H04L 7/0331* (2013.01); *G06F 2212/202* (2013.01)

(58) Field of Classification Search
USPC .......................... 375/356, 357, 362, 373–376
See application file for complete search history.

(56) References Cited

U.S. PATENT DOCUMENTS

| | | | |
|---|---|---|---|
| 2008/0175343 A1* | 7/2008 | Nakayama | H04L 7/0037 375/373 |
| 2011/0156783 A1 | 6/2011 | Pavlovic et al. | |

FOREIGN PATENT DOCUMENTS

| | | |
|---|---|---|
| CN | 102638661 A | 8/2012 |
| CN | 103312317 A | 9/2013 |
| CN | 203775187 U | 8/2014 |
| CN | 108449086 B | 8/2018 |
| CN | 108667466 A | 10/2018 |

OTHER PUBLICATIONS

International Search Report and Written Opinion for the International Patent Application No. PCT/CN2019/112558 dated Jan. 23, 2020.

The State Intellectual Property Office of People's Republic of China. First Office Action for CN Application No. 201811564486.6 and English translation, dated Aug. 12, 2022, pp. 1-10.

The State Intellectual Property Office of People's Republic of China First Search Report for CN Application No. 2018115644866 and English translation, dated Aug. 8, 2022, pp. 1-5.

\* cited by examiner

DEVICE AND METHOD FOR REALIZING DATA SYNCHRONIZATION

CROSS-REFERENCE TO RELATED APPLICATION

This application is a national stage filing under 35 U.S.C. § 371 of international application number PCT/CN2019/112558, filed Oct. 22, 2019, which claims priority to Chinese patent application No. 201811564486.6, filed Dec. 20, 2018. The contents of these applications are incorporated herein by reference in their entirety.

TECHNICAL FIELD

The present disclosure relates to data synchronization technology, and more particularly, to a device and method for realizing data synchronization.

BACKGROUND

In an application scenario of 5G massive MIMO antenna, in a system with a plurality of radio frequency (RF) chips, synchronization processing is required for each of the RF chips to guarantee the synchronous RF signal reception and emission of the chips. In addition, the synchronization processing is also required for a plurality of channels in a single RF chip. In 5G mode, a delay difference less than 20 ns between channels is required to guarantee the synchronous data reception and output for the channels over the setup and hold time.

SUMMARY

Given that, according to embodiments of the present disclosure, a device and a method for realizing data synchronization are provided.

According to an aspect of the present disclosure, the device for realizing data synchronization may include:
a synchronization circuit for a plurality of radio frequency (RF) chips, configured to realize work clock synchronization among the plurality of RF chips; and/or
a synchronization circuit for a plurality of channels in a single chip, configured to realize data synchronization among the plurality of channels in the single chip.

In an embodiment of the present disclosure, the synchronization circuit for the plurality of RF chips may include:
a phase-locked loop (PLL) circuit, configured to receive a reference clock signal, and output a high-frequency signal with a frequency n times that of the reference clock signal, wherein n is greater than or equal to 2;
a frequency divider circuit, configured to divide the frequency of the high-frequency signal output by the PLL circuit to obtain a work clock signal with a frequency required by a chip;
a phase difference calculation circuit, configured to obtain a delay difference between the reference clock signal and the work clock signal; and
a phase synchronization control circuit, configured to compare the delay difference with a preset delay threshold, and control the PLL circuit to adjust a phase of the output high-frequency signal in response to the delay difference being larger than the preset delay threshold.

In an embodiment of the present disclosure, obtaining the delay difference between the reference clock signal and the work clock signal by the phase difference calculation circuit may include:
sampling the phase difference between the reference clock signal and the work clock signal by using the high-frequency signal output by the PLL circuit to obtain a minimum difference between a reference clock edge and a work clock edge, and multiplying the minimum difference by a clock cycle of the high-frequency signal for sampling to obtain the delay difference between the reference clock signal and the work clock signal.

In an embodiment of the present disclosure, for each of the plurality of channels, the synchronization circuit for the plurality of channels in the single chip may include:
a first synchronization unit, configured to keep data extracted from the plurality of channels consistent by a first synchronization signal;
a second synchronization unit, configured to allow the plurality of channels to read data synchronously while the data is transmitted from the first synchronization unit to the second synchronization unit; and
a third synchronization unit, configured to allow the plurality of channels to read data synchronously while the data is transmitted from the second synchronization unit to the third synchronization unit.

In an embodiment of the present disclosure, allowing the plurality of channels to read the data synchronously by the second synchronization unit and the third synchronization unit may include:
writing the data into a dual-port random access memory (RAM), and allowing the plurality of channels to read the data in the RAM synchronously by a second synchronization signal.

According to another aspect of the present disclosure, the method for realizing data synchronization may include:
realizing work clock synchronization of a plurality of RF chips; and/or
realizing data synchronization of a plurality of channels in a single chip.

In an embodiment of the present disclosure, realizing work clock synchronization of the plurality of RF chips may include:
receiving a reference clock signal, and outputting a high-frequency signal with a frequency n times that of the reference clock signal, wherein n is greater than or equal to 2;
dividing the frequency of the high-frequency signal to obtain a work clock signal with a frequency required by a chip; and
obtaining a delay difference between the reference clock signal and the work clock signal, and adjusting a phase of the output high-frequency signal in response to the delay difference being greater than a preset delay threshold.

In an embodiment of the present disclosure, obtaining the delay difference between the reference clock signal and the work clock signal may include:
sampling a phase difference between the reference clock signal and the work clock signal by using the high-frequency signal to obtain a minimum difference between a reference clock edge and a work clock edge, and multiplying the minimum difference by a clock cycle of the high-frequency signal for sampling to obtain the delay difference between the reference clock signal and the work clock signal.

In an embodiment of the present disclosure, realizing data synchronization of the plurality of channels in the single chip may include:
keeping data extracted from the plurality of channels consistent by a first synchronization signal; and allowing the plurality of channels to read data synchronously during transmission of the extracted data.

In an embodiment of the present disclosure, allowing the plurality of channels to read the data synchronously during the transmission of the extracted data may include:

writing data into a dual-port RAM, and allowing the plurality of channels to read the data in the RAM synchronously by a second synchronization signal.

Compared with existing technologies, according to some embodiments of the present disclosure, the device for realizing data synchronization includes a synchronization circuit for a plurality of radio frequency (RF) chips, and/or a synchronization circuit for a plurality of channels in a single chip. The synchronization circuit for a plurality of RF chips is used for realizing work clock synchronization among the plurality of RF chips, while the synchronization circuit for a plurality of channels in a single chip is used for realizing data synchronization of the plurality of channels in the single chip. According to the embodiments of the present disclosure, the requirements regarding synchronous data input and output can be met, whereby the consistency of data transmission speed is guaranteed.

Other features and advantages of the embodiments of the present disclosure will be described in the following description, and will become apparent in part from the description or be understood by implementing the embodiments of the present disclosure. The objects and other advantages of the embodiments of the present disclosure can be realized and obtained by the structures pointed out in the description, claims and drawings.

BRIEF DESCRIPTION OF DRAWINGS

The drawings are provided for a further understanding of the technical schemes of the present disclosure, and constitute a part of the description. The drawings and embodiments of the present application are used to explain the technical schemes of the present disclosure, and are not intended to limit the present disclosure.

DETAILED DESCRIPTION

Figure 1:
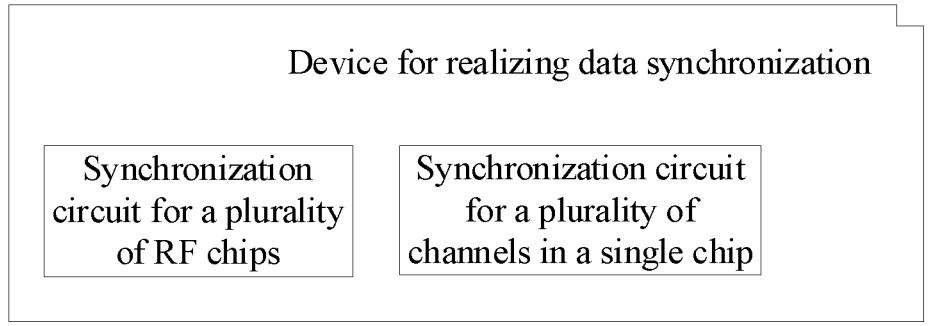
FIG. 1 is a block diagram of a device for realizing data synchronization according to an embodiment of the present disclosure.

To make the objectives, technical schemes and advantages of the embodiments of the present disclosure clearer, the embodiments of the present disclosure will be described in detail below with reference to the accompanying drawings. It should be noted that the embodiments of the present application and the features in the embodiments may be combined to derive other embodiments not explicitly described.

The steps shown in the flowcharts in the drawings may be performed in a computer system such as a set of computer-executable instructions. And, although a logical order is shown in the flowcharts, in some cases the steps shown or described may be performed in a different order than here.

According to an embodiment of the present disclosure, a device for realizing data synchronization is provided, as shown in FIG. 1, the device includes:

a synchronization circuit for a plurality of RF chips, and a synchronization circuit for a plurality of channels in a single chip.

In another embodiment of the present disclosure, the device for realizing data synchronization includes:

a synchronization circuit for a plurality of RF chips, or a synchronization circuit for a plurality of channels in a single chip.

The synchronization circuit for the plurality of RF chips is configured to realize work clock synchronization among the plurality of RF chips, while the synchronization circuit for the plurality of channels in the single chip is configured to realize data synchronization of the plurality of channels in the single chip.

A clock phase difference among the plurality of RF chips may be caused by four factors: firstly, there are different paths from a clock chip to different RF chips; secondly, in RF chips there are different paths for clock signals to their respective phase-locked loops (PLL); thirdly, delays of a frequency divider for generating frequency division clocks of the PLL are different; fourthly, the paths of the clock signals in a transmission data link are different. These problems of causing clock phase asynchronization may be solved by the design of printed circuit board (PCB) and system calibration. However, due to the consideration in system resource, the synchronization circuit for the plurality of RF chips according to an embodiment of the present disclosure is used to solve the problems of clock phase asynchronization caused by the PLL in chips. In the embodiment, the synchronization circuit for the plurality of RF chips may include following circuits.

A PLL circuit is configured to receive a reference clock signal and output a high-frequency signal with a frequency n times that of the reference clock signal, where n is greater than or equal to 2. A frequency divider circuit is configured to divide the frequency of the high-frequency signal output by the PLL circuit to obtain a work clock signal with a frequency required by a chip. A phase difference calculation circuit is configured to obtain a delay difference between the reference clock signal and the work clock signal by comparison. A phase synchronization control circuit is configured to compare the delay difference with a preset delay threshold and controlling the PLL circuit to adjust a phase of the output high-frequency signal in response to the delay difference being larger than the preset delay threshold.

In an embodiment, to obtain the delay difference between the reference clock signal and the work clock signal, the phase difference calculation circuit may be configured to:

sample the phase difference between the reference clock signal and the work clock signal by using the high-frequency signal output by the PLL circuit to obtain a minimum difference between a reference clock edge and a work clock edge, and multiply the minimum difference by a clock cycle of the high-frequency signal for sampling to obtain the delay difference between the reference clock signal and the work clock signal.

According to the synchronization circuit for the plurality of RF chips of the embodiment of the present disclosure, synchronization of the clock phases of the plurality of RF chips is realized by synchronizing the output clock signals of the PLL circuit of the plurality of RF chips with the reference clock signal.

Figure 2:
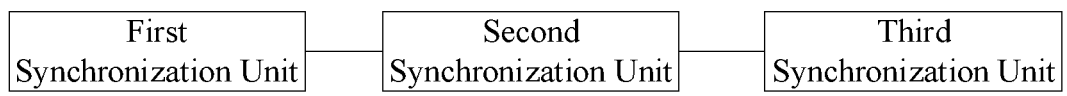
FIG. 2 is a block diagram of each channel in a synchronization circuit for a plurality of channels in a single chip according to an embodiment of the present disclosure.

In an embodiment of the present disclosure, as shown in FIG. 2, for each of the plurality of channels, the synchronization circuit for the plurality of channels in the single chip is includes a first synchronization unit, a second synchronization unit and a third synchronization unit.

The first synchronization unit is configured to keep data extracted from the plurality of channels consistent by a first synchronization signal. The first synchronization signal may be a system synchronization signal sys_ref, which is a pulse signal reaching the plurality of channels in the single chip synchronously.

The second synchronization unit is configured to allow the plurality of channels to read data synchronously when the data is transmitted from the first synchronization unit to the second synchronization unit.

The third synchronization unit is configured to allow the plurality of channels to read data synchronously when the data is transmitted from the second synchronization unit to the third synchronization unit.

To allow the plurality of channels to read the data synchronously, the second synchronization unit and the third synchronization unit are further configured to:
  write the data into a dual-port RAM, and render the plurality of channels to read the data in the RAM synchronously by a second synchronization signal, where the first synchronization signal and the second synchronization signal may be the same signal.

The first synchronization unit may be an ADC clock domain, the second synchronization unit may be a calibration clock domain, and the third synchronization unit may be a 204B clock domain.

The synchronization circuit for the plurality of channels in the single chip can allow the plurality of channels to register/delay incoming data synchronously, and register/delay outgoing data synchronously.

The synchronization circuit for the plurality of RF chips and the synchronization circuit for the plurality of channels in the single chip mentioned in the above embodiments are described with specific application examples.

Figure 3:
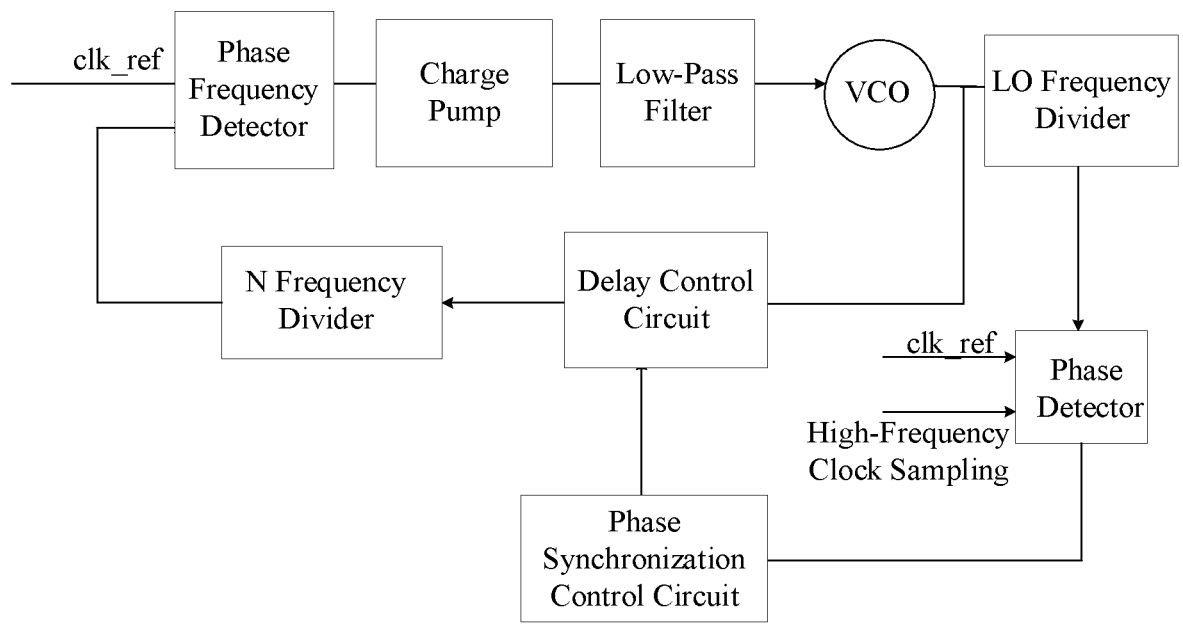
FIG. 3 is a block diagram of a synchronization circuit for a plurality of RF chips according to an embodiment of the present disclosure.

FIG. 3 is a block diagram of a synchronization circuit for a plurality of RF chips according to an embodiment of the present disclosure.

As shown in FIG. 3, the synchronization circuit for the plurality of RF chips includes a PLL circuit, a local oscillator (LO) frequency divider circuit, a phase difference calculation circuit and a phase synchronization control circuit.

The PLL circuit includes a phase frequency detector (PFD), a charge pump, a low-pass filter (LPF), a voltage-controlled oscillator (VCO), a delay control circuit and an N frequency divider The PLL circuit is configured to receive a reference clock signal and output a high-frequency signal with a frequency n times that of the reference clock signal, where n is greater than or equal to 2.

The PFD is configured to detect a phase difference between the reference clock signal and the feedback clock signal, and output a positive pulse signal in response to a presence of a phase lead of the reference clock signal, or output a negative pulse signal in response to a presence of a phase lead of the feedback clock signal.

The charge pump is configured to respectively control two current mirrors in the charge pump to charge and discharge a capacitor according to the positive pulse signal and the negative pulse signal, where the positive pulse signal instructs to charge the capacitor to increase the voltage; and the negative pulse signal instructs to discharge the capacitor to reduce the voltage.

The LPF is configured to retain a low-frequency voltage signal representing phase difference information and filter out high-frequency noise.

The VCO is configured to control an output clock frequency to increase or decrease according to the low-frequency voltage signal representing the phase difference information.

The N frequency divider is configured to generate a feedback clock signal with a frequency is N times the reference clock frequency.

Through such a feedback process, the PLL circuit gradually renders the reference clock signal and the feedback clock signal to have the same frequency and phase.

The LO frequency divider circuit is configured to divide the frequency of the high-frequency signal output by the PLL circuit to obtain a work clock signal with a frequency required by a chip.

The phase difference calculation circuit (i.e., a phase detector in FIG. 3) is configured to obtain a delay difference between the reference clock signal and the work clock signal.

The phase synchronization control circuit is configured to compare the delay difference with a preset delay threshold, and sending a control signal to a delay control module of the PLL circuit in response to the delay difference being larger than the preset delay threshold; or performing nothing in response to the delay difference being less than or equal to the preset delay threshold.

The delay control circuit is configured to receive the control of the phase synchronization control circuit to increase or decrease a phase of the VCO output signal. In an embodiment, the phase of the VCO output signal is increased when the delay difference is greater than 180°; and the phase of the VCO output signal is decreased when the delay difference is less than 180° and greater than the preset delay threshold.

Figure 4:
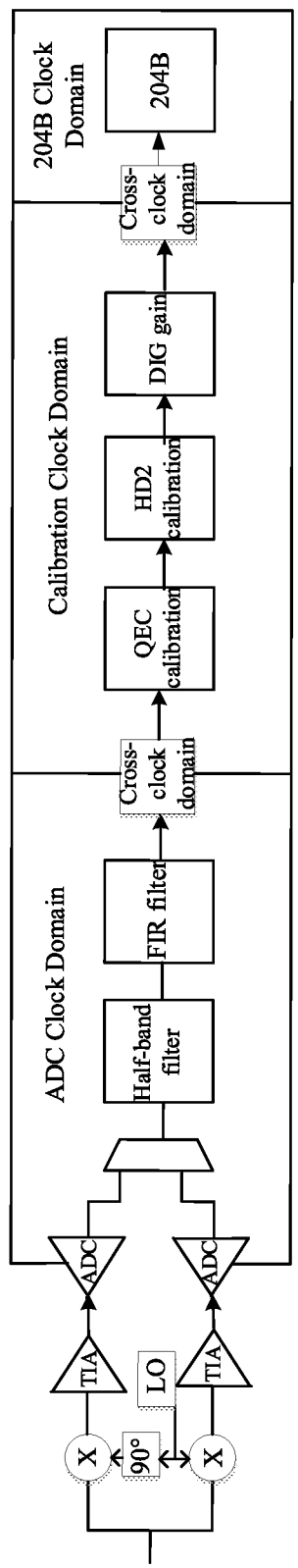
FIG. 4 is a block diagram of a synchronization circuit for a plurality of channels in a single chip according to an embodiment of the present disclosure.

FIG. 4 is a block diagram of a synchronization circuit for a plurality of channels in a single chip in an embodiment of the present disclosure. As shown in the FIG. 4, each of the plurality of channels mainly include an ADC clock domain, a calibration clock domain and a 204B clock domain.

The ADC clock domain is configured to keep data extracted from the plurality of channels consistent by a first synchronization signal. The ADC clock domain includes a half-band filter and an FIR filter. The half-band filter is configured to perform synchronization processing while extracting data. For example, when the data transmitted in four channels is abababab, and the half-band filter is used for double extraction, by the first synchronization signal the half-band filter causes the data acquired by each of the plurality of channels to be aaaa or bbbb. The FIR filter is configured to filter the synchronized data.

The calibration clock domain is configured to cause each of the plurality of channels to read data synchronously when the data is transmitted from the first synchronization unit to the second synchronization unit. The calibration clock domain includes QEC calibration, HD2 calibration and DIG gain. The QEC calibration refers to IQ imbalance calibration. Due to differences in gain, phase and flatness between two signals I and Q, the two signals I and Q may need to be compensated to reduce distortion. The HD2 calibration is configured to eliminate harmonic components of received signals. The DIG gain refers to a digital gain control module for stabilizing signal gain.

The 204B clock domain is configured to cause each of the plurality of channels read data synchronously when the data is transmitted from the second synchronization unit to the third synchronization unit.

A dual-port RAM (i.e., a cross-clock domain module in FIG. 3) is configured to transmit data between the ADC clock domain and the calibration clock domain, and between the calibration clock domain and the 204B clock domain. The dual-port is configured to perform cross-clock domain processing on frequencies of different clock signals used in different clock domains and complete the cross-clock domain function by using RAM, to realize data synchronization between channels at this point.

According to an embodiment of the present disclosure, a method for realizing data synchronization includes steps of:
realizing work clock synchronizations of a plurality of RF chips; and realizing data synchronization of a plurality of channels in a single chip.

According to another embodiment of the present disclosure, the method for realizing data synchronization includes steps of:
realizing work clock synchronizations of a plurality of RF chips; or realizing data synchronization of a plurality of channels in a single chip.

In an embodiment, the step of realizing work clock synchronizations among the plurality of RF chips includes:
receiving a reference clock signal and outputting a high-frequency signal with a frequency n times that of the reference clock signal, where n is greater than or equal to 2;
dividing the frequency of the high-frequency signal to obtain a work clock signal with a frequency required by a chip; and
obtain a delay difference between the reference clock signal and the work clock signal, and adjusting a phase of the output high-frequency signal in response to the delay difference being greater than a preset delay threshold.

In an embodiment, the step of obtaining the delay difference between the reference clock signal and the work clock signal includes:
sampling a phase difference between the reference clock signal and the work clock signal by using the high-frequency signal to obtain a minimum difference between a reference clock edge and a work clock edge, and multiplying the minimum difference by a clock cycle of the high-frequency signal for sampling to obtain the delay difference between the reference clock signal and the work clock signal.

According to the synchronization method for the plurality of RF chips according to the embodiments of the present disclosure, synchronization of the clock phases of the plurality of RF chips is realized by synchronizing the output clock signals of the PLL circuit of the plurality of RF chips with the reference clock signal.

In an embodiment, the step of realizing data synchronization of the plurality of channels in the single chip includes:
keeping data extracted from the plurality of channels consistent by a first synchronization signal; and
rendering the plurality of channels to read the data synchronously during transmission of the extracted data.

In an embodiment, the step of rendering the plurality of channels to read the data synchronously during the transmission of the extracted data includes writing the data into a dual-port RAM, and rendering the plurality of channels to read the data in the RAM synchronously by a second synchronization signal.

The synchronization method for the plurality of channels in the single chip according to the embodiments of the present disclosure allows the plurality of channels to register/delay incoming data synchronously, and register/delay outgoing data synchronously.

The synchronization method for the plurality of RF chips and the synchronization method for the plurality of channels in the single chip are described below with specific application examples.

Figure 5:
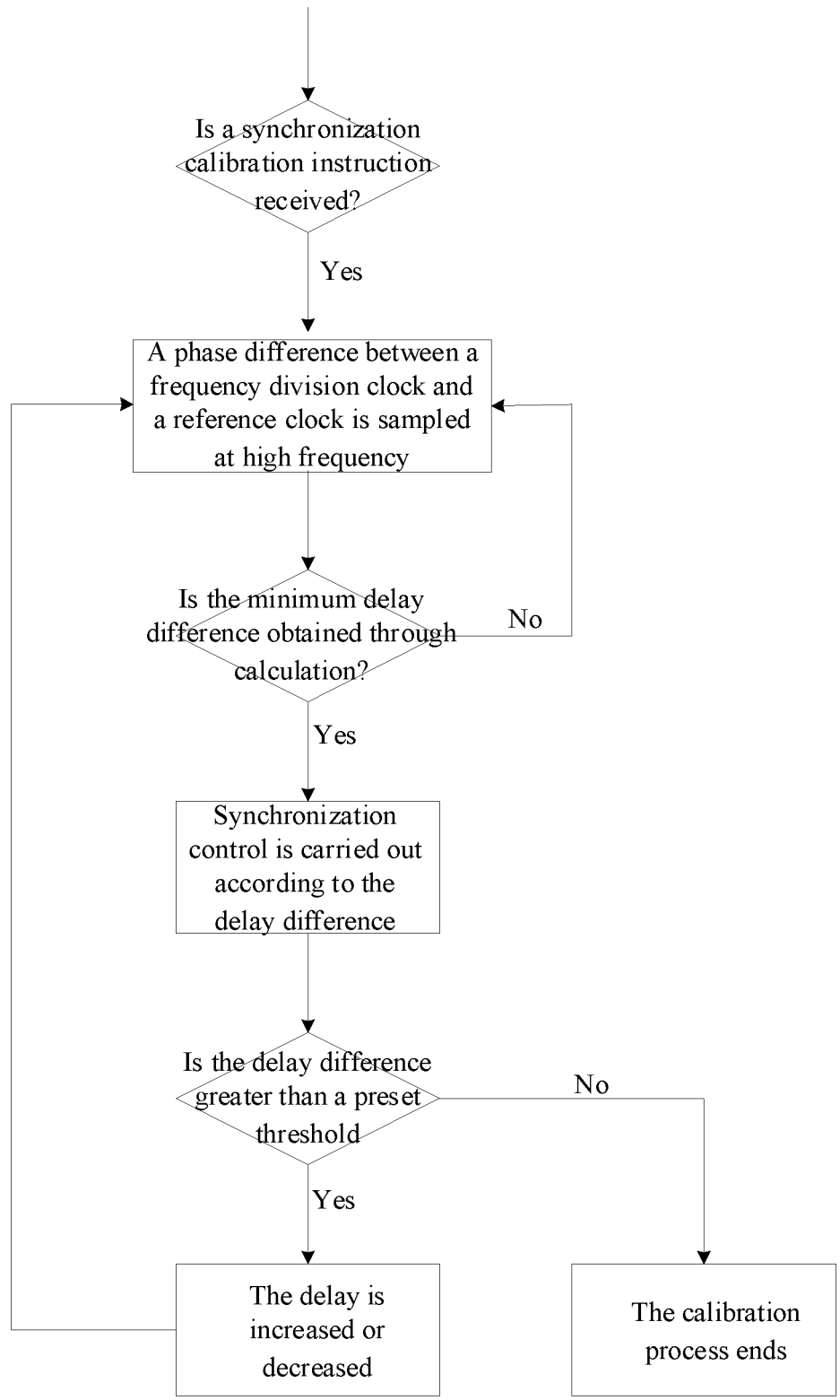
FIG. 5 is a flowchart of a synchronization method for a plurality of RF chips according to an embodiment of the present disclosure.

FIG. 5 is a flowchart of a synchronization method for a plurality of RF chips shown in an embodiment of the present disclosure. As shown in FIG. 5, the method includes:
receiving a reference clock signal and outputting a high-frequency signal with a frequency n times that of the reference clock signal, where n is greater than or equal to 2;
dividing the frequency of the high-frequency signal to obtain a work clock signal with a frequency required by a chip; and
determining whether a synchronization calibration instruction is received; if the synchronization calibration instruction is received, sampling the phase difference between the work clock with the frequency required by the RF chip (the frequency division clock) and the reference clock at high frequency; determining whether the obtained delay difference is minimum; if the obtained delay difference is minimum, carrying out synchronization control according to the delay difference: increasing or decreasing the delay of the frequency division clock if the delay difference is greater than a preset threshold; or performing no processing if the delay difference is less than or equal to the preset threshold, and the calibration process ends.

Figure 6:
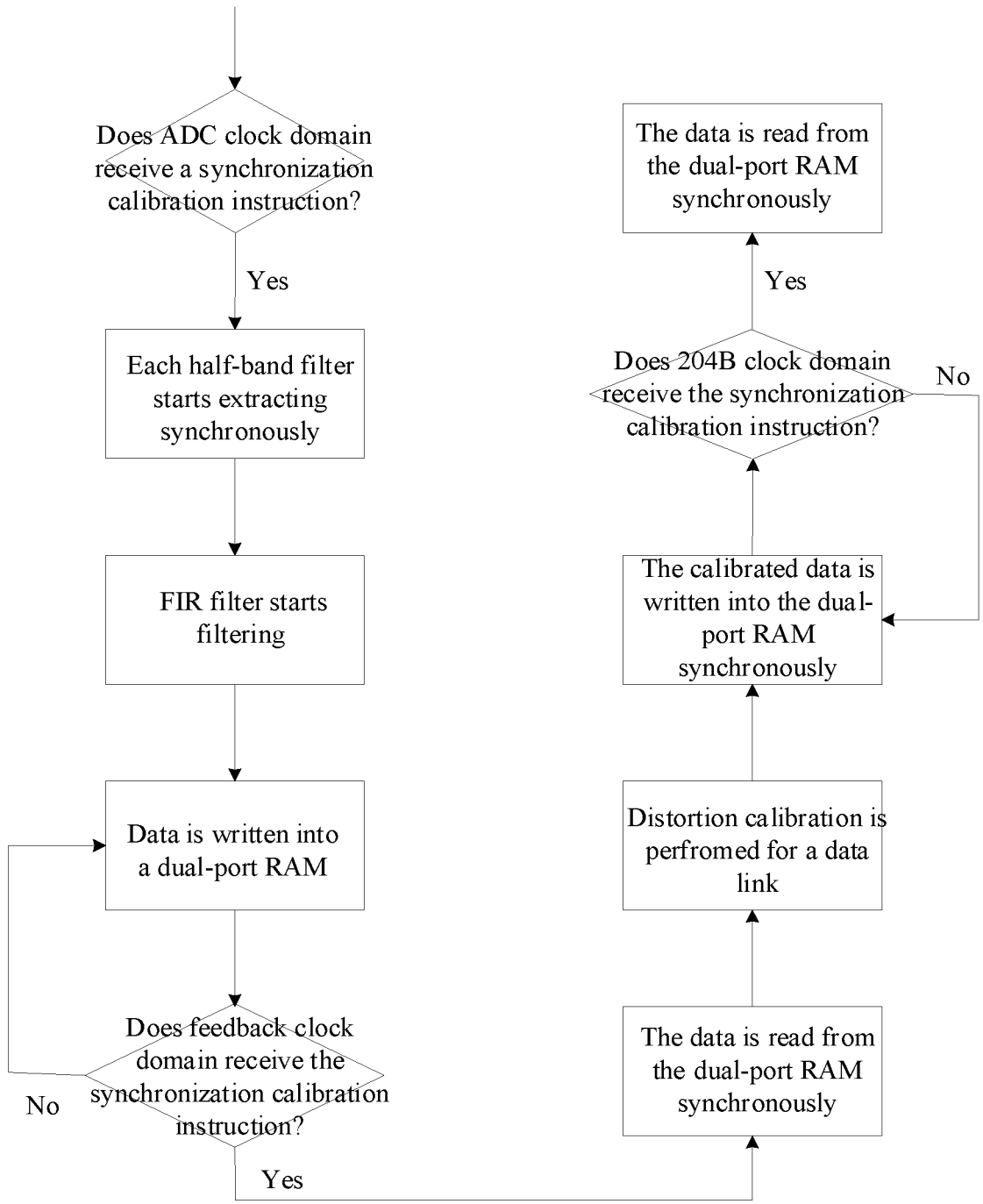
FIG. 6 is a flowchart of a synchronization method for a plurality of channels in a single chip according to an embodiment of the present disclosure.

FIG. 6 is a flowchart of a synchronization circuit for a plurality of channels in a single chip according to an embodiment of the present disclosure. As shown in FIG. 6, the flow includes:
a half-band filter in an ADC clock domain extracts data after the ADC clock domain receives a synchronization calibration instruction, a FIR filter performs filtering and writes the data into a dual-port RAM;
a feedback clock domain synchronously reads the data in the dual-port RAM after receiving the synchronization calibration instruction, performs distortion calibration on a data link, and writes the calibrated data into the dual-port RAM synchronously; and
a 204B clock domain synchronously reads the data in the dual-port RAM after receiving the synchronization calibration instruction.

Those having ordinary skills in the art will appreciate that all or some of the steps, systems, functional modules/units in the apparatus disclosed above may be implemented as software, firmware, hardware, and appropriate combinations thereof. In a hardware implementation, partitioning between functional modules/units mentioned in the above description does not necessarily correspond to partitioning of physical components. For example, a physical component may have multiple functions, or a function or step may be performed by several physical components in cooperation. Some or all components may be implemented as software executed by a processor, such as a digital signal processor or a microprocessor, or as hardware, or as an integrated circuit, such as an application-specific integrated circuit. Such software may be distributed over computer-readable media, which may include computer storage media (or non-transitory media) and communication media (or transitory media). As known to those having ordinary skills in the art, the term computer storage medium includes transitory and non-transitory, removable and non-removable medium implemented in any method or technique for storing information, such as computer-readable instructions, data structures, program modules or other data. Computer storage media include, but are not limited to, RAMs, ROMs, EEPROMs, flash memory or other memory technologies, CD-ROM, digital versatile disks (DVDs) or other optical disk storage, magnetic cassettes, magnetic tapes, magnetic disk storage or other magnetic storage devices, or any other medium that may be used to store desired information and that may be accessed by a computer. Furthermore, as is well known to those having ordinary skills in the art, a communication medium typically contains computer-readable instructions, data structures, program modules, or other data in a modulated data signal such as a carrier wave or other transmission mechanism, and may include any information delivery medium.

The invention claimed is:

1. A device for realizing data synchronization, comprising:
   a synchronization circuit for a plurality of radio frequency (RF) chips configured to realize synchronization work clock among the plurality of RF chips; and
   a synchronization circuit for a plurality of channels in a single chip configured to realize data synchronization among the plurality of channels in the single chip;
   wherein the synchronization circuit for the plurality of RF chips comprises:
   a phase-locked loop (PLL) circuit, configured to receive a reference clock signal, and output a high-frequency signal with a frequency n times that of the reference clock signal, wherein n is greater than or equal to 2;
   a frequency divider circuit, configured to divide the frequency of the high-frequency signal output by the PLL circuit to obtain a work clock signal with a frequency required by a chip;
   a phase difference calculation circuit, configured to obtain a delay difference between the reference clock signal and the work clock signal; and
   a phase synchronization control circuit, configured to compare the delay difference with a preset delay threshold, and control the PLL circuit to adjust a phase of the output high-frequency signal in response to the delay difference being larger than the preset delay threshold.

2. The device for realizing data synchronization of claim 1, wherein obtaining the delay difference between the reference clock signal and the work clock signal by the phase difference calculation circuit comprises:
   sampling the phase difference between the reference clock signal and the work clock signal by using the high-frequency signal output by the PLL circuit to obtain a minimum difference between a reference clock edge and a work clock edge, and multiplying the minimum difference by a clock cycle of the high-frequency signal for sampling to obtain the delay difference between the reference clock signal and the work clock signal.

3. The device for realizing data synchronization of claim 1, wherein,
   for each of the plurality of channels, the synchronization circuit for the plurality of channels in the single chip comprises:
   a first synchronization unit, configured to keep data extracted from the plurality of channels consistent by a first synchronization signal;
   a second synchronization unit, configured to allow the plurality of channels to read data synchronously while the data is transmitted from the first synchronization unit to the second synchronization unit; and
   a third synchronization unit, configured to allow the plurality of channels to read data synchronously while the data is transmitted from the second synchronization unit to the third synchronization unit.

4. The device for realizing data synchronization of claim 3, wherein,
   allowing the plurality of channels to read the data synchronously while the data is transmitted from the second synchronization unit to the third synchronization unit comprises:
   writing the data into a dual-port random access memory (RAM), and allowing the plurality of channels to read the data in the RAM synchronously by a second synchronization signal.

5. A method for realizing data synchronization, comprising:
   realizing work clock synchronization of a plurality of RF chips; and
   realizing data synchronization of a plurality of channels in a single chip;
   wherein realizing work clock synchronization of the plurality of RF chips comprises:
   receiving a reference clock signal, and outputting a high-frequency signal with a frequency n times that of the reference clock signal, wherein n is greater than or equal to 2;
   dividing the frequency of the high-frequency signal to obtain a work clock signal with a frequency required by a chip; and
   obtaining a delay difference between the reference clock signal and the work clock signal, and adjusting a phase of the output high-frequency signal in response to the delay difference being greater than a preset delay threshold.

6. The method for realizing data synchronization of claim 5, wherein obtaining the delay difference between the reference clock signal and the work clock signal comprises:
   sampling a phase difference between the reference clock signal and the work clock signal by using the high-frequency signal to obtain a minimum difference between a reference clock edge and a work clock edge, and multiplying the minimum difference by a clock cycle of the high-frequency signal for sampling to obtain the delay difference between the reference clock signal and the work clock signal.

7. The method for realizing data synchronization of claim 5, wherein realizing data synchronization of the plurality of channels in the single chip comprises:
   keeping data extracted from the plurality of channels consistent by a first synchronization signal; and
   allowing the plurality of channels to read data synchronously during transmission of the extracted data.

8. The method for realizing data synchronization of claim 7, wherein allowing the plurality of channels to read the data synchronously during the transmission of the extracted data comprises:
   writing data into a dual-port RAM, and allowing the plurality of channels to read the data in the RAM synchronously by a second synchronization signal.

9. The device for realizing data synchronization of claim 1, wherein, for each of the plurality of channels, the synchronization circuit for the plurality of channels in the single chip comprises:
- a first synchronization unit, configured to keep data extracted from the plurality of channels consistent by a first synchronization signal;
- a second synchronization unit, configured to allow the plurality of channels to read data synchronously while the data is transmitted from the first synchronization unit to the second synchronization unit; and
- a third synchronization unit, configured to allow the plurality of channels to read data synchronously while the data is transmitted from the second synchronization unit to the third synchronization unit.

10. The device for realizing data synchronization of claim 9, wherein,
allowing the plurality of channels to read the data synchronously by the second synchronization unit and the third synchronization unit comprises:
writing the data into a dual-port random access memory (RAM), and allowing the plurality of channels to read the data in the RAM synchronously by a second synchronization signal.

11. The device for realizing data synchronization of claim 3, wherein,
for each of the plurality of channels, the synchronization circuit for the plurality of channels in the single chip comprises:
- a first synchronization unit, configured to keep data extracted from the plurality of channels consistent by a first synchronization signal;
- a second synchronization unit, configured to allow the plurality of channels to read data synchronously while the data is transmitted from the first synchronization unit to the second synchronization unit; and
- a third synchronization unit, configured to allow the plurality of channels to read data synchronously while the data is transmitted from the second synchronization unit to the third synchronization unit.

12. The device for realizing data synchronization of claim 11, wherein,
allowing the plurality of channels to read the data synchronously by the second synchronization unit and the third synchronization unit comprises:
writing the data into a dual-port random access memory (RAM), and allowing the plurality of channels to read the data in the RAM synchronously by a second synchronization signal.

13. The method for realizing data synchronization of claim 5, wherein realizing data synchronization of the plurality of channels in the single chip comprises:
keeping data extracted from the plurality of channels consistent by a first synchronization signal; and
allowing the plurality of channels to read data synchronously during transmission of the extracted data.

14. The method for realizing data synchronization of claim 13, wherein allowing the plurality of channels to read the data synchronously during the transmission of the extracted data comprises:
writing data into a dual-port RAM, and allowing the plurality of channels to read the data in the RAM synchronously by a second synchronization signal.

15. The method for realizing data synchronization of claim 6, wherein realizing data synchronization of the plurality of channels in the single chip comprises:
keeping data extracted from the plurality of channels consistent by a first synchronization signal; and
allowing the plurality of channels to read data synchronously during transmission of the extracted data.

16. The method for realizing data synchronization of claim 15, wherein allowing the plurality of channels to read the data synchronously during the transmission of the extracted data comprises:
writing data into a dual-port RAM, and allowing the plurality of channels to read the data in the RAM synchronously by a second synchronization signal.

* * * * *